United States Patent
Yang et al.

(10) Patent No.: US 10,185,374 B2
(45) Date of Patent: Jan. 22, 2019

(54) STORAGE DRIVE RISER (71) Applicant: Hewlett Packard Enterprise Development LP, Houston, TX (US)

(72) Inventors: Shou-Jen Yang, Taipei (TW); John Norton, Houston, TX (US); Sunil Ganta, Cypress, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/546,180

(22) PCT Filed: Jan. 30, 2015

(86) PCT No.: PCT/US2015/013762
§ 371 (c)(1),
(2) Date: Jul. 25, 2017

(87) PCT Pub. No.: WO2016/122594
PCT Pub. Date: Aug. 4, 2016

(65) Prior Publication Data
US 2017/0371383 A1    Dec. 28, 2017

(51) Int. Cl.
*G06F 1/16* (2006.01)
*G06F 1/18* (2006.01)
(Continued)

(52) U.S. Cl.
CPC ............ *G06F 1/187* (2013.01); *F16B 5/0635* (2013.01); *F16B 5/10* (2013.01); *F16B 21/02* (2013.01);
(Continued)

(58) Field of Classification Search
CPC .......... G06F 1/185; G06F 1/186; G06F 1/187; H05K 1/14; H05K 7/1429; H05K 7/1487; H05K 1/144; H05K 2201/045; H01R 12/721; H01R 12/7082; H01R 12/716; H01R 12/523
See application file for complete search history.

(56) References Cited

U.S. PATENT DOCUMENTS 3,868,806 A * 3/1975 Dey ...................... F16B 5/0208
411/353
4,701,984 A 10/1987 Wyckoff
(Continued)

FOREIGN PATENT DOCUMENTS

WO    WO-02061588    8/2002

OTHER PUBLICATIONS

Addonics Product; "2.5" M2 (NGFF) SSD drive," http://www.addonics.com/products/ad25rn2ssd.php> Retrieved from Internet Dec. 17, 2014.

*Primary Examiner* — James Wu
(74) *Attorney, Agent, or Firm* — Hewlett Packard Enterprise Patent Department (57) ABSTRACT

A storage drive riser may include a riser board. The riser board may include an edge connector, a storage drive connector to operably engage with a storage drive, and a retention aperture. The retention aperture may be longitudinally aligned with the storage drive connector. The storage drive riser may also include a storage drive retainer to insertably engage with the retention aperture and to retain the storage drive to the riser board with a retention protrusion.

16 Claims, 5 Drawing Sheets

(51) Int. Cl.
*F16B 5/06* (2006.01)
*F16B 5/10* (2006.01)
*F16B 21/02* (2006.01)
*F16B 33/00* (2006.01)
*H05K 7/14* (2006.01)

(52) U.S. Cl.
CPC ............ *F16B 33/002* (2013.01); *G06F 1/185* (2013.01); *H05K 7/1487* (2013.01)

(56) References Cited

U.S. PATENT DOCUMENTS

| | | | |
|---|---|---|---|
| 4,841,100 A | | 6/1989 | Ignasiak |
| 5,018,982 A | | 5/1991 | Speraw |
| 5,754,412 A | * | 5/1998 | Clavin .................. H05K 7/142 174/138 D |
| 8,325,493 B2 | | 12/2012 | McClellan |
| 9,854,673 B2 | * | 12/2017 | Yang ...................... G06F 1/185 |
| 2002/0045364 A1 | | 4/2002 | Hsia |
| 2005/0191875 A1 | * | 9/2005 | Yang .................. H01R 13/6215 439/73 |
| 2009/0185356 A1 | * | 7/2009 | Liao ...................... H05K 7/142 361/759 |
| 2010/0049893 A1 | | 2/2010 | Drako |
| 2013/0128464 A1 | | 5/2013 | Chen et al. |
| 2013/0232298 A1 | * | 9/2013 | Schuette ............... G06F 3/0626 711/103 |
| 2016/0066450 A1 | * | 3/2016 | Morita ................. H05K 5/0217 361/679.01 |

* cited by examiner

STORAGE DRIVE RISER

BACKGROUND

Storage drives can be used to store data from computer systems, including server systems. Further, storage drives can be used to transfer data between multiple computer systems. Storage drives may be easily installed or removed from computer systems, or storage drives may also be installed in the computer system internally.

Storage drives and other expansion cards can be engaged with an expansion slot of the computer system to enhance the performance and capabilities of the computer system. The expansion card may be engaged with the expansion slot through the use of a riser card. A riser card may engage with both the expansion slot and the expansion card and raise the expansion card above the system board of the computer system. A riser card thereby may allow the expansion card to be engaged with the computer system in a more compact configuration.

DETAILED DESCRIPTION

Storage drives can have edge connectors that connect the storage drive to a receiving connector in an associated computer system. The edge connectors can include multiple pins (e.g., a gold finger connector). The edge connector can include multiple signal pins, at least one ground pin, and at least one power pin. The multiple signal pins communicate a signal to and from a memory portion of the storage drive and the receiving connector, while the at least one ground pin connects the storage drive to ground, and the at least one power pin provides power to the storage drive from the receiving connector. The ground and power pins may be longer than the signal pins.

Storage drives can be engaged with the associated computer system through expansion slots of the computer system, the expansion slots being the receiving connectors. Expansion slots can be located on the system board, or motherboard, of the computer system and can engage with expansion components, such as storage drives, in order to enhance the performance or capabilities of the computer system, such as storage capacity. Storage drives may require the use of an intermediary component in order to engage the storage drive with the expansion slot. In such a situation, the intermediary component may include the receiving connector. Intermediary components may include cables, adapter boards, riser boards, or other components that can adapt the storage drive connector to the expansion slot.

Riser boards can be used to engage different types of expansion components with expansion slots. Riser boards may engage with the expansion slot, using an edge connector, in a manner that is perpendicular to the system board. Riser boards may also include a receiving connector such that the expansion component engages with the riser board in a manner perpendicular to the riser board. Riser boards may, therefore, allow the expansion component to engage with the expansion slot while the expansion component is disposed above the system board in a more compact configuration than if the expansion component was insertably engaged with the expansion slot directly.

Riser boards may, in some situations, only engage with one storage drive at a time. This may require the use of multiple riser boards to engage with multiple expansion slots in order to utilize more than one storage drive with the computer system. Riser boards may, in further situations, engage with more than one storage drive, however, the storage drives may be aligned adjacently to each other in a side-by-side fashion on the riser board. This configuration increases the necessary height of the riser board off of the system board in a computer system. Therefore, in some situations, a riser board accommodating more than one storage drive may not be able to fit within certain computer system's size constraints, therefore limiting the amount of storage capacity that can be added to the computer system.

Implementations of the present disclosure provide a riser board that can engage with multiple storage drives in a low-profile, back-to-back configuration. This configuration minimizes the necessary height of the riser board off of the system board in a computer system, requiring less space in the computer system's enclosure or case.

Further, storage drives may engage with a riser board through the use of mechanical fasteners. The mechanical fasteners may include one or more female nuts, standoffs, and a male screw. The mechanical fasteners may require tools to install and uninstall, and may only be able to secure one storage drive at a time. Therefore, swapping one storage drive for another may be relatively time-intensive and require tools, as each storage drive is individually retained by the fasteners. Additionally, storage drives may be available in different lengths, sometimes corresponding with different storage capabilities of the drive. It may be desirable to change one storage drive on a riser board for another storage drive of a different length, if storage requirements of the computer system change, for example. This may require tools to uninstall the screw from the nut, and also to uninstall the nut and the standoff from the riser board and re-install the nut and standoff on the riser board in a different engagement position. Tools may then be further required to reinstall the screw into the nut, thereby retaining the new, different length storage drive.

Implementations of the present disclosure provide a riser board that can engage multiple lengths of a storage drive type without the need for tools. This minimizes the required fastening components and the time required to install and uninstall the storage drive and fastening components. Further, implementations of the present disclosure provide a riser board that can mechanically retain two storage drives with one, tool-less fastener.

Figure 1A:
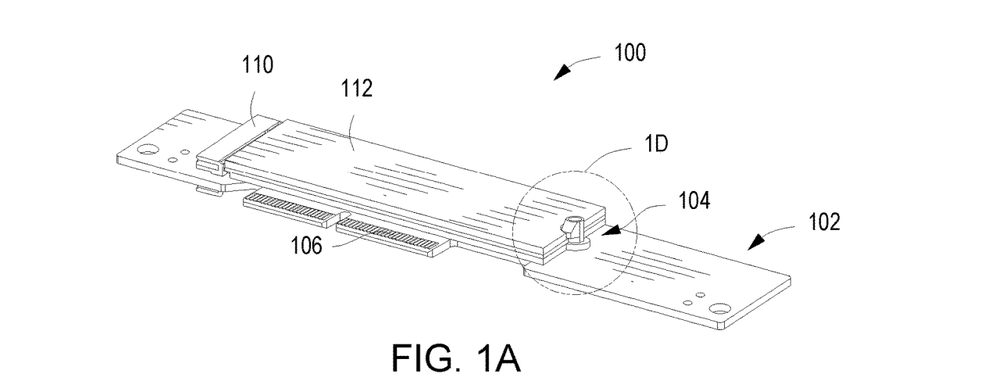
FIG. 1A is a perspective view of an example storage drive riser including a riser board and a storage drive retainer.
Figure 1B:
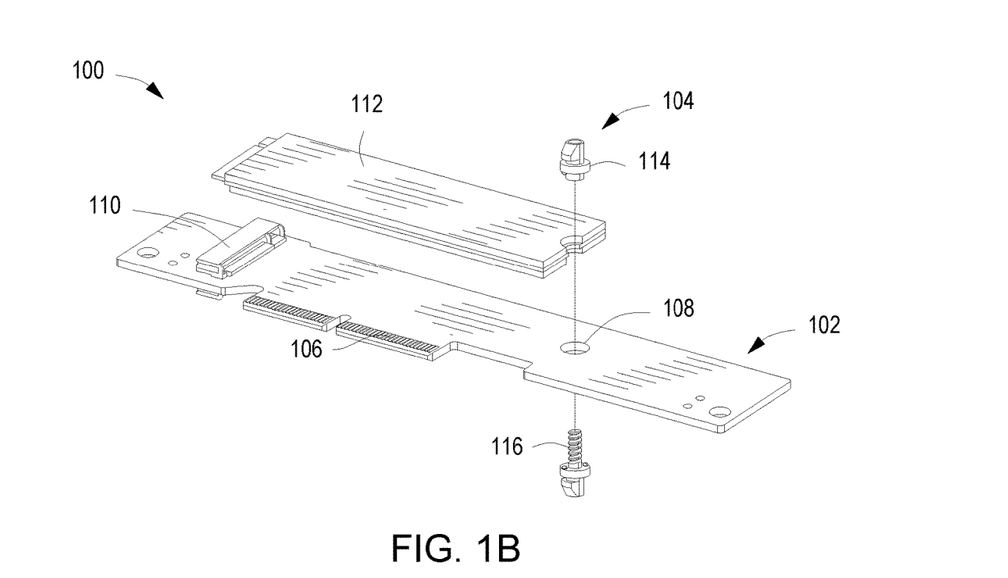
FIG. 1B is a perspective exploded view of an example storage drive riser.

Referring now to FIGS. 1A and 1B, a perspective view and an exploded view of an example storage drive riser 100 is illustrated, respectively. The example storage drive riser 100 may include a riser board 102 and a storage drive retainer 104. The riser board 102 may structurally support and electrically connect multiple electronic components. The riser board 102 may, in some implementations, connect multiple electronic components with conductive pathways, which, in further implementations, may include copper. In yet further implementations, the riser board 102 may be made, at least partially, out of a non-conductive substrate with copper pathways etched onto the substrate. In some implementations, the non-conductive substrate may include silicone. In further implementations, the riser board 102 might comprise a single-layer printed circuit board (PCB), or a multi-layer PCB in other implementations.

The riser board 102 may include an edge connector 106, a retention aperture 108 to insertably engage with the storage drive retainer 104, and a storage drive connector 110 to engage with a storage drive 112. The edge connector 106 may include multiple pins, including signal pins, power pins, and ground pins, the multiple pins being operably engaged with the conductive pathways of the riser board 102. The multiple pins may be to engage with complementary receptacle pins in a computer system's expansion slot such that the riser board 102 is operably engaged with such an expansion slot and, thus, the computer system. In some implementations, the expansion slot may be disposed on the system board of the computer system. The edge connector 106 may engage with the expansion slot by being inserted into the slot from a direction parallel to the slot opening and perpendicular to the system board. The edge connector 106 may facilitate electrical communication via a signal path between the riser board 102 and the expansion slot and, thus, an expansion bus and main system bus of the computer system. In further implementations, the multiple pins of the edge connector 106 may be able to support multiple signal paths from the riser board 102 to the computer system's expansion slot. In yet further implementations, the expansion slot may be a Peripheral Component Interconnect Express (PCIe) expansion slot, the edge connector 106 being operably engageable with the PCIe expansion slot.

The retention aperture 108 may be a hole or orifice extending through the riser board 102. The storage drive retainer 104 may be to insertably engage with the retention aperture 108. In some implementations, the retention aperture 108 may be longitudinally aligned with the storage drive connector 110. In other words, the retention aperture 108 may be aligned with the storage drive connector 110 such that, if the storage drive retainer 104 were insertably engaged with the retention aperture 108, the storage drive retainer 104 may be able to retain a distal end of the storage drive 112. The distal end of the storage drive 112 may refer to the end opposite from the storage drive's edge connector. In some implementations, the retention aperture 108 may be longitudinally aligned with the center of the storage drive connector 110.

The storage drive retainer 104 may include a retention nut 114 and a retention stud 116 to insertably engage with the retention nut. The retention stud 116 may insertably engage with the retention nut 114 through the retention aperture 108, such that the riser board 102 is sandwiched in between the retention nut 114 and the retention stud 116. In some implementations, the riser board 102 may be sandwiched in between respective shoulder portions of the retention nut 114 and the retention stud 116. In some implementations, the retention stud 116 and the retention nut 114, once engaged, may be able to rotate relative to each other and relative to the riser board 102. In further implementations, the retention nut 114 and the retention stud 116 may be vertically adjustable, such that the distance from the retention nut 114 to the riser board 102 and the retention stud 116 to the riser board 102 can vary. In further implementations, the retention nut 114 and stud 116 may be vertically adjustable to accommodate riser boards 102 of different thicknesses.

Figure 1C:
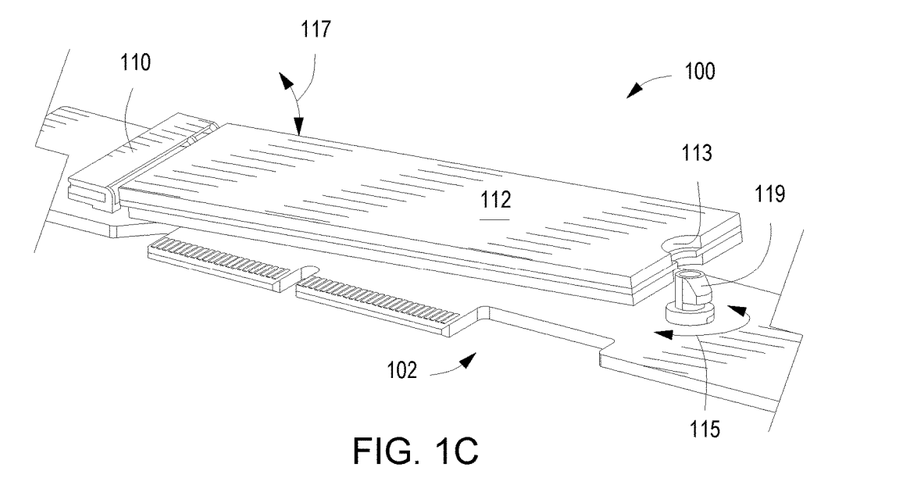
FIG. 1C is a perspective view of an example storage drive riser.
Figure 1D:
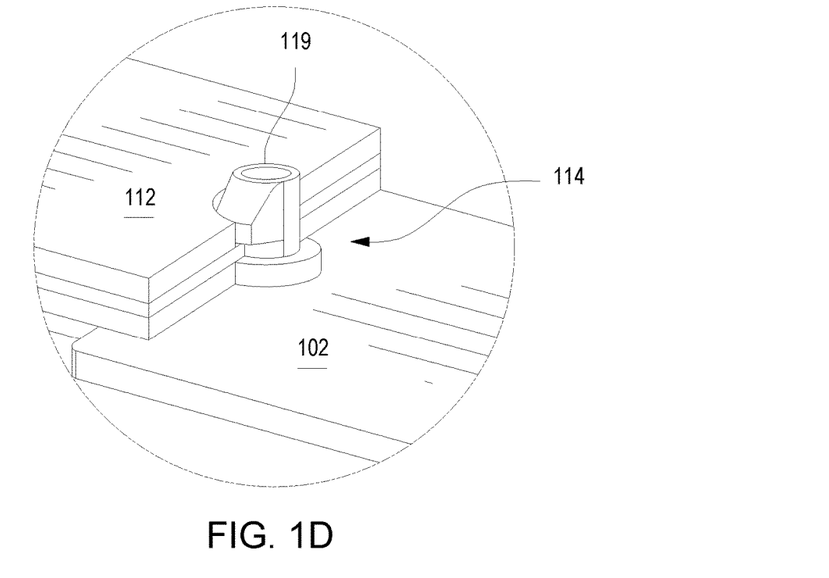
FIG. 1D is a detail view of an example storage drive riser.

Referring additionally to FIGS. 1C and 1D, the storage drive connector 110 may be an electrical interface to communicate with an edge connector of the storage drive 112, the edge connector in communication with a memory portion of the storage drive 112. The storage drive connector 110 may further be operably engaged with the conductive pathways of the riser board 102, and, thus, the edge connector 106 of the riser board 102. In some implementations, the storage drive connector 110 may include multiple receptacle pins that may engage with multiple pins of the storage drive 112 edge connector, and the multiple pins may include signal pins, power pins, and ground pins. The engagement of the multiple receptacle pins of the storage drive connector 110 with the multiple pins of the storage drive 112 edge connector may facilitate electrical communication between the storage drive 112 and the riser board 102. The riser board 102 may, therefore, facilitate electrical communication between the storage drive 112 and the computer system through the edge connector 106 and the computer system's expansion slot.

The riser board 102 may receive and engage with the storage drive 112 through the storage drive connector 110 and the storage drive retainer 104. The storage drive connector 110 may receive the storage drive 112 at an angle and allow the storage drive 112 to be tilted downward in a direction 117 such that the storage drive connector 110 electrically engages with the multiple pins of the edge connector of the storage drive 112. Once engaged with the storage drive connector 110, the storage drive 112 may be disposed on the riser board 102 such that a retention cutout 113 on the storage drive 112 may be substantially aligned with the retention aperture 108. Substantially aligned may indicate the ability for the storage drive retainer 104 to be insertably engaged with the retention aperture 108 such that a retention protrusion 119 of the storage drive retainer 104 may overlap and engage with the retention cutout 113, thereby retaining the storage drive 112 to the riser board 102 in its engaged position with the storage drive connector 110. In some implementations, the retention nut 114 and the retention stud 116 may each have a retention protrusion 119, either of which can be used to retain the storage drive 112 to the riser board 102, depending on the direction of engagement between the storage drive retainer 104 and the retention aperture 108. Further, the retention protrusion 119 of the storage drive retainer 104 may engage with the retention cutout 113 by being rotated relative to the riser board in a direction 115, from an open position to a closed position. In other words, the storage drive retainer 104 may be insertably engaged with the retention aperture 108 such that the retention protrusion 119 is facing away from the storage drive connector 110, in the open position, to allow the storage drive 112 to be tilted downward in the direction 117 until electrically engaged with the storage drive connector 110. The storage drive retainer 104, or the part thereof having the retention protrusion 119, may then be rotated in the retention aperture 108 along direction 115 until the retention protrusion 119 is facing the storage drive connector and, thus, overlapping the retention cutout 113 of the storage drive 112, in a closed position, as illustrated in FIG. 1D.

In some implementations, the storage drive 112 can be removed from its engaged state with the riser board 102 and the storage drive connector 110 by reversing the above actions. In other words, the storage drive retainer 104, or the part thereof having the retention protrusion 119, may be rotated in the retention aperture 108 from the closed position, retaining the storage drive 112, along the direction 115, to the open position. Once the storage drive retainer 104 is in the open position, the storage drive 112 may be tilted upward in the direction 117 until it is disengaged from the storage drive connector 110 and free to be removed from the riser board 102.

In some implementations, the storage drive retainer 104 can be rotated in the retention aperture 108 from the open position to the closed position, or vice versa, by a user's hand, without the need for tools. In further implementations, the storage drive retainer can be rotated along the direction 115 from the closed to open position, or vice versa, in either a clockwise or a counter-clockwise manner. In some implementations, the retention cutout 113 is located in the center of the distal end of the storage drive 112. In further implementations, the storage drive is a M.2 Next Generation Form Factor (NGFF) solid state storage drive and the storage drive connector 110 may be an interface to engage with a M.2 NGFF solid state storage drive.

Figure 2A:
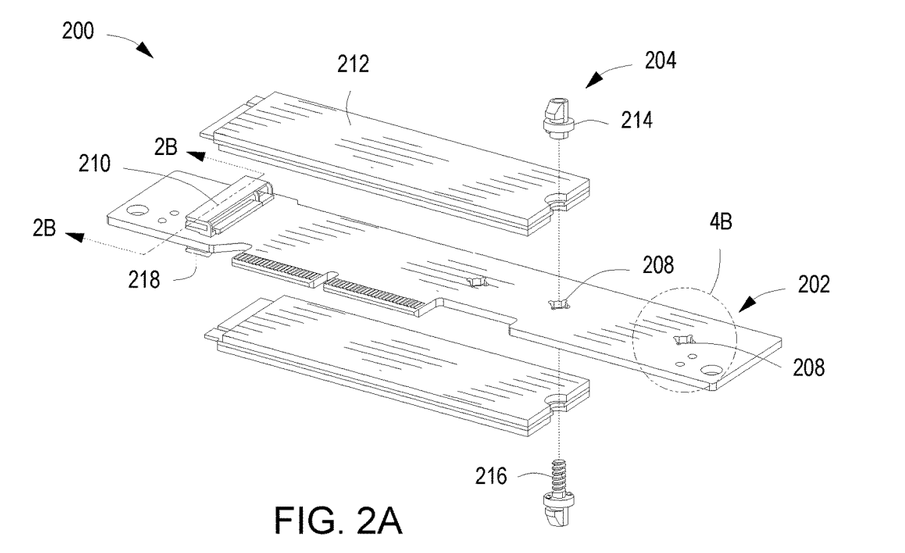
FIG. 2A is a perspective exploded view of an example storage drive riser.

Referring now to FIG. 2A, a perspective exploded view of an example storage drive riser 200 is illustrated. Storage drive riser 200 may be similar to storage drive riser 100. Further, the similarly named elements of storage drive riser 200 may be similar in function to the elements of storage drive riser 100, as they are described above. Storage drive riser 200 may include a riser board 202 and a storage drive retainer 204. Riser board 202 may include a retention aperture 208 to insertably engage with the storage drive retainer 204, and a first storage drive connector 210 to engage with a first storage drive 212. Riser board 202 may further include a plurality of retention apertures 208 longitudinally aligned with each other along the riser board 202, as illustrated in FIG. 2A. Each of the plurality of retention apertures 208 may be engageable with the storage drive retainer 204, such that the storage drive retainer 204 is capable of retaining multiple lengths of storage drives 212. In some implementations, the retention apertures 208 may be spaced along the riser board 202 at intervals such that the storage drive retainer 204 is capable of retaining M.2 NGFF solid state storage drives that are 30 millimeters (mm), 42 mm, 60 mm, 80 mm, and 110 mm in length to the riser board 202.

In further implementations, riser board 202 may additionally include a second storage drive connector 218 to engage with a second storage drive 220. In some implementations, the second storage drive connector 218 may be disposed on the opposite side of the riser board 202 from the first storage drive connector 210 in a back-to-back manner. The second storage drive connector 218 may be to engage with the second storage drive 220 on the opposite side of the riser board 202 from the engagement of the first storage drive connector 210 and the first storage drive 212, with a retention cutout from each of the first and second storage drives 212 and 220 substantially aligning with one of the retention apertures 208. The storage drive retainer 204 may, therefore, retain both the first and second storage drives 212 and 220, respectively, by insertably engaging with the aligned retention aperture 208, as illustrated in FIG. 2A. The storage drive retainer 204 may include a retention nut 214 and a retention stud 216 to insertably engage with the retention nut 214 through the retention aperture 208. The retention nut 214 may include a retention protrusion to retain the first storage drive 212 to the riser board 202, as described above regarding FIGS. 1C-D. Similarly, the retention stud 216 may include a retention protrusion to retain the second storage drive 220 to the opposite side of the riser board 202 from the first storage drive 212. The retention nut 214 and the retention stud 216 may be rotatable relative to each other and relative to the riser board such that the retention nut 214 and the retention stud 216 can each independently engage and disengage with the retention cutout on the respective storage drive. Therefore, both the first and second storage drives 212 and 220 may be retained to and removed from the riser board 202 independently from each other.

Figure 2B:
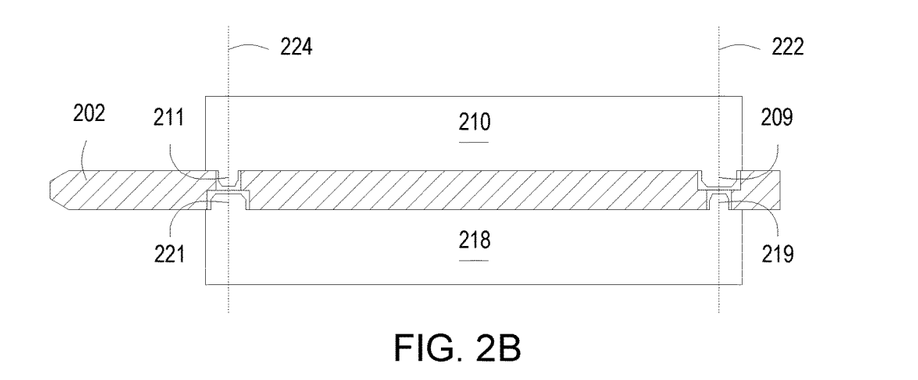
FIG. 2B is a cross-sectional view of an example storage drive riser.

In some implementations, the first and second storage drive connectors 210 and 218 can be aligned with each other while disposed on opposite sides of the riser board 202. That is, the first and second storage drive connectors 210 and 218 may share the same footprint, as additionally illustrated in FIG. 2B. FIG. 2B is a cross-sectional view of the storage drive riser 200, taken along cut line 2B-2B of FIG. 2A. If the first and second storage drive connectors 210 and 218 share the same footprint, the first and second storage drives 212 and 220 may be the same length and both be retained by the same storage drive retainer 204. To align the first and second storage drive connectors 210 and 218 such that they share the same footprint, the riser board 202 may further include a first and second alignment aperture, the axes of which are illustrated by dashed lines 222 and 224, respectively, in FIG. 2B. The first storage drive connector 210 may include a first alignment peg 209 and a second alignment peg 211, each of which may be a cylinder extending from a bottom surface of the first storage drive connector 210. The first and second alignment pegs 209 and 211 may be to extend into the corresponding alignment apertures 222 and 224 on the riser board 202 in order to fix the position of the first storage drive connector 210 on the riser board 202. Similarly, the second storage drive connector 218 may include first and second alignment pegs 221 and 219, respectively.

In some implementations, each first alignment peg 209 and 221 may be larger in diameter than the corresponding second alignment pegs 211 and 219. This may be to ensure the correct alignment direction of the first and second storage drive connectors 210 and 218 on the riser board 202. The riser board 202 may, thus, include first and second alignment apertures 222 and 224 that each include a counterbore. The counterbores may be oppositely-oriented on the riser board 202 such that the first alignment aperture 222 has a counterbore that can receive the first alignment peg 209 of the first storage drive connector 210. Similarly, the second alignment aperture 224 may include a counterbore that can receive the first alignment peg 221 of the second storage drive connector 218, as illustrated in FIG. 2B. Further, the first and second alignment apertures 222 and 224 may each further include a through hole that is coaxial with the associated counterbore. As illustrated in FIG. 2B, the through hole of the first alignment aperture 222 may be to receive the second alignment peg 219 of the second storage drive connector 218 and the through hole of the second alignment aperture 224 may be to receive the second alignment peg 211 of the first storage drive connector 210.

Figure 3:
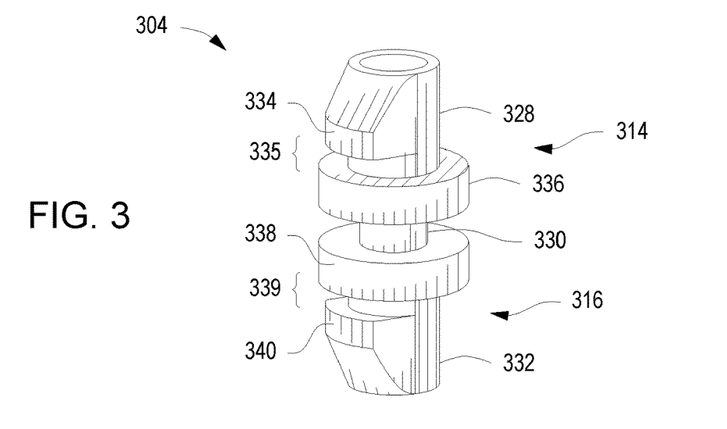
FIG. 3 is a perspective view of an example storage drive retainer including a retention nut and a retention stud.

Referring now to FIG. 3, a perspective view of an example storage drive retainer 304 for use with an example storage drive riser is illustrated. Storage drive retainer 304 may be similar to storage drive retainer 104 or 204. Further, the similarly named elements of storage drive retainer 304 may be similar in function to the elements of storage drive retainer 104 or 204, as they are described above. The storage drive retainer 304 may include a retention nut 314 and a retention stud 316 to insertably engage with the retention nut 314 through a retention aperture. The retention nut 314 may include an engagement barrel 328 and a spacer portion 330 disposed at one end of the engagement barrel 328. The engagement barrel 328 may be a cylinder, in some implementations. The engagement barrel 328 may include an inner bore, which, in some implementations, may be a blind hole extending into the engagement barrel 328, along the engagement barrel 328 axis, from the spacer portion 330. In further implementations, the inner bore may be a through hole extending through the entire retention nut 314.

The retention nut 314 may further include a first shoulder portion 336 extending axially away from the spacer portion 330, up the engagement barrel 328. The first shoulder portion 336 may be a cylinder sharing an axis with the engagement barrel 328 and may extend radially from the engagement barrel 328, e.g., the first shoulder portion 336 may have a larger diameter that the engagement barrel 328. Further, the spacer portion 330 may have a diameter that is less than the diameter of the retention aperture, while the first shoulder portion 336 may have a diameter that is greater than the diameter of the retention aperture.

Additionally, the retention nut 314 may include a first retention protrusion 334 extending radially from the engagement barrel 328. In some implementations, the first retention protrusion 334 may extend continuously along the circumference of the engagement barrel 328 for 180 degrees or less. The first retention protrusion 334 may further be axially set apart from the first shoulder portion 336, along the axis of the engagement barrel 328. The first retention protrusion 334 may be axially set apart from the first shoulder portion 336 such that a first retention notch 335 is defined in between the first shoulder portion 336 and the first retention protrusion 334. A portion of a storage drive may be disposed in the retention notch 335 in between the first shoulder portion 336 and the retention protrusion 334. In some implementations, the retention notch 335 may be able to accommodate the retention cutout on a M.2 NGFF solid state storage drive in between the first shoulder portion 336 and the first retention protrusion 334.

Referring still to FIG. 3, the storage drive retainer 304 may include a retention stud 316 to insertably engage with the retention nut 314. The retention stud 316 may insertably engage with the retention nut 314 such that the retention stud 316 and the retention nut 314 may rotate relative to each other, along the axis of the engagement barrel 328. The retention stud 316 may include an engagement pin 332 to engage with the engagement barrel 328. In some implementations, at least a portion of the engagement pin 332 may be to insert into the engagement barrel 328. In further implementations, the engagement pin 332 may be at least partially cylindrical and may be to insert into the inner bore of the engagement barrel 328. The retention stud 316 may further include a second shoulder portion 338, the second shoulder portion 338 extending axially along and radially from the engagement pin 332. In some implementations, the second shoulder portion 338 may share a cylindrical axis with at least part of the engagement pin. The retention stud 316 may further include a second retention protrusion 340 extending radially from the engagement pin 332 and axially set apart from the second shoulder portion 338. In some implementations, the second retention protrusion 340 may extend continuously along the circumference of the engagement pin 332 for 180 degrees or less. The second retention protrusion 340 may be axially set apart from the second shoulder portion 338 such that a second retention notch 339 is defined in between the second shoulder portion 338 and the second retention protrusion 340. In some implementations, the second shoulder portion 338, the second retention notch 339, and the second retention protrusion 340 may be similar to the first retention protrusion 334, the first retention notch 335, and the first shoulder portion 336, respectively.

Figure 4A:
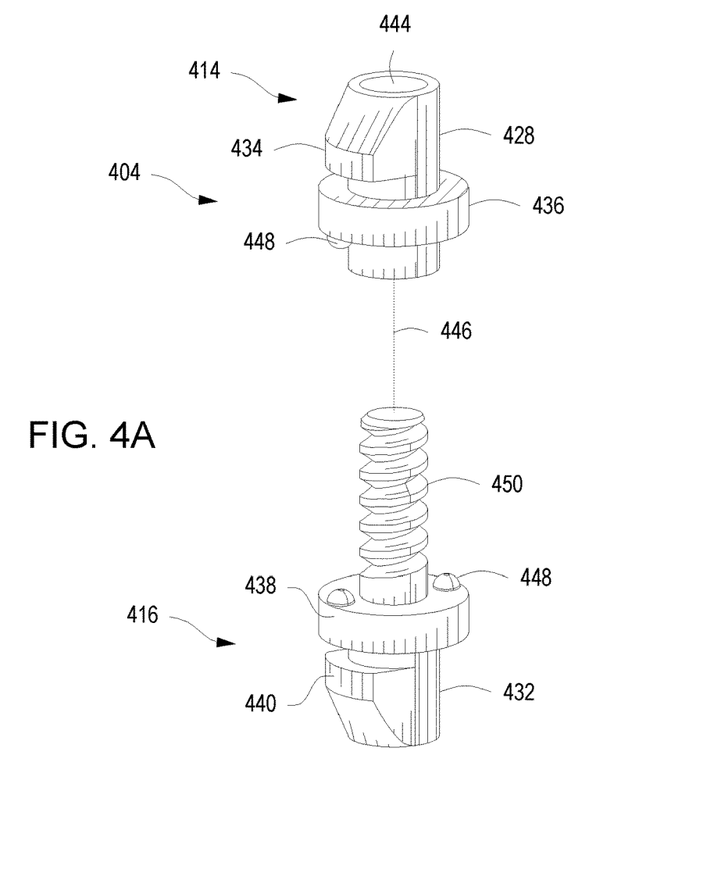
FIG. 4A is a perspective exploded view of an example storage drive retainer.

Referring now to FIG. 4A, a perspective exploded view of a storage drive retainer 404 for use with an example storage drive riser is illustrated. Storage drive retainer 404 may be similar to storage drive retainer 104, 204, or 304. Further, the similarly named elements of storage drive retainer 404 may be similar in function to the elements of storage drive retainer 104, 204, or 304, as they are described above. The storage drive retainer 404 may include a retention nut 414 and a retention stud 416. The retention nut 414 may include an engagement barrel 428, the engagement barrel 428 including a female threaded portion 444. Similarly, the retention stud 416 may include an engagement pin 432, the engagement pin 432 including a male threaded portion 450. The male threaded portion 450 may be to engage with the female threaded portion 444 along an engagement axis 446.

The retention stud 416 and the retention nut 414 may each further include at least one detent protrusion 448. In some implementations, only the retention nut 414 or the retention stud 416 may include at least one detent protrusion 448. In further implementations, both the retention stud 416 and the retention nut 414 may each include multiple detent protrusions 448. Each detent protrusion 448 on the retention nut 414 may be disposed on a first shoulder portion 436, and extend out from the shoulder portion 436 along the engagement barrel 428 and parallel to the engagement axis 446, as shown in FIG. 4A. Similarly, each detent protrusion 448 on the retention stud 416 may be disposed on a second shoulder portion 438, and extend out from the shoulder portion 438 along the engagement pin 432 and parallel to the engagement axis 446.

Figure 4B:
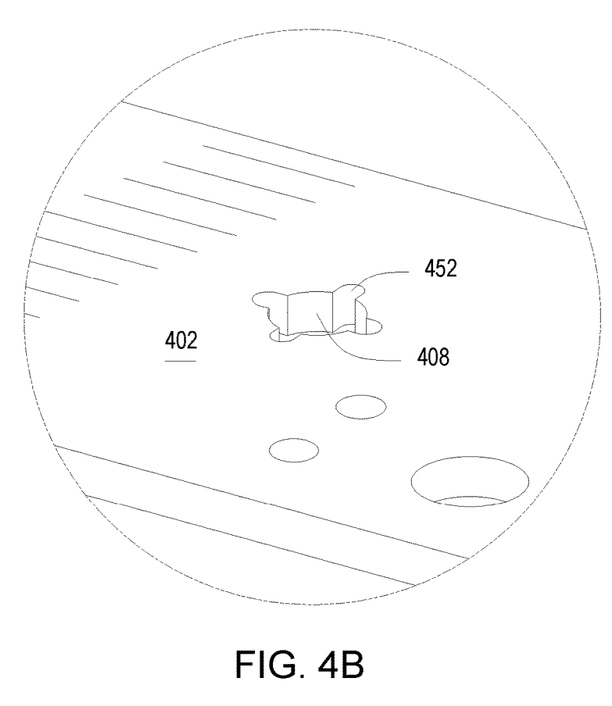
FIG. 4B is a detail view of an example riser board.

Referring additionally to FIG. 4B, the retention nut 414 and the retention stud 416 may engage through a retention aperture 408 in a riser board 402 of an example storage drive riser. FIG. 4B is a detail view of such a riser board 402, including a retention aperture 408. When the retention stud 416 and the retention nut 414 are being engaged with one another, the male and female threaded portions 450 and 444, respectively, may urge the retention stud 416 and the retention nut 414 towards each other along engagement axis 446, and towards the riser board 402. Once engaged, the storage drive retainer 404 may sandwich the riser board 402 in between the retention nut 414 and the retention stud 416, as mentioned above regarding FIGS. 1A-B. The retention nut 414 and the retention stud 416 may each be rotated around the engagement axis 446 to retain one or two storage drives to the riser board 402, also as mentioned above regarding FIGS. 1C-D and 2A. The storage drive retainer 404 may further be vertically adjustable along the engagement axis 446 by rotating the retention nut 414 and/or the retention stud 416 such that the male and female threaded portions 450 and 444 interact in an unthreading or loosening fashion. The storage drive retainer 404 may be vertically adjusted along the engagement axis in order for the retainer 404 to accommodate a riser board 402 of a different thickness.

Additionally, the first and second shoulder portions 436 and 438, respectively, may be urged towards opposite sides of the riser board 402 until the detent protrusions 448 each engage with a detent cutout 452. Each retention aperture 408 may include at least one detent cutout 452, each detent cutout 452 being an aperture or orifice in the riser board 402 and also being adjacent to the retention aperture 408. In some implementations, the detent cutouts 452 may extend the entire way through the riser board 402. The detent cutouts 452, in further implementations, may be semi-circular cutouts in the riser board 402. In some implementations, the detent cutouts 452 may be oriented in a complementary fashion to the orientation of the detent protrusions 448, and sized such that each cutout 452 can receive a detent protrusion 448. Each detent cutout 452 may receive a detent protrusion 448 such that the detent protrusion 448 nests within the detent cutout and prevents the corresponding retention nut 414 or retention stud 416 from rotating further in a tightening fashion. The engagement of the detent protrusions 448 within the detent cutouts 452 may also prevent the accidental rotation of the retention nut 414 and stud 416 in a loosening fashion. In some implementations, the detent cutouts 452 may be oriented around the circumference of the retention aperture.

What is claimed is:

1. A storage drive riser, comprising:
a riser board, including:
an edge connector;
a storage drive connector to operably engage and physically connect with a storage drive; and
a retention aperture longitudinally aligned with the storage drive connector; and
a storage drive retainer to be inserted through the retention aperture and to retain the storage drive to the riser board, the storage drive retainer includes a retention nut and a retention stud to be inserted through the retention nut, the retention nut having a retention protrusion capable of retaining the storage drive to the riser board and also capable of opposing movement of the storage drive in both a first direction parallel to a surface of the riser board and a second direction that is perpendicular to the surface of the riser board;
wherein the storage drive connector is to operably engage and physically connect with a second storage drive and the retention stud has a retention protrusion capable of retaining the second storage drive to the riser board and also capable of opposing movement of the second storage drive in both a third direction parallel to the surface of the riser board and a fourth direction that is perpendicular to the surface of the riser board.

2. The storage drive riser of claim 1, wherein the storage drive retainer is to no longer retain the storage drive to the riser board upon rotating the storage drive retainer so that the retention protrusion faces away from the storage drive connector.

3. The storage drive riser of claim 2, wherein the storage drive is a M.2Next Generation Form Factor (NGFF) storage drive, the retention protrusion to engage with a retention cutout on the M.2 NGFF solid state storage drive.

4. The storage drive riser of claim 1, wherein the retention aperture is longitudinally aligned with each other along the riser board.

5. The storage drive riser of claim 4, wherein the retention aperture includes at least one detent cutout.

6. The storage drive riser of claim 4, wherein the storage drive retainer is engageable with the retention aperture.

7. The storage drive riser of claim1, wherein the storage drive connector is to engage with an M.2 Next Generation Form Factor (NGFF) storage drive.

8. The storage drive riser of claim 1, wherein the retention nut and the retention stud are rotatable relative to each other and to the riser board such that the retention nut and the retention stud can each independently engage with the retention cutout on the storage drive.

9. The storage drive riser of claim 1, wherein the retention aperture includes a detent cutout, the detent cutout is an orifice in the riser board.

10. The storage drive riser of claim 9, wherein the detent cutout is configured to receive a detent protrusion such that the detent protrusion nests within the detent cutout to resist the retention nut from rotating further in a tightening fashion.

11. The storage drive riser of claim 10, wherein the detent cutout is oriented around the circumference of the retention aperture in the riser board.

12. The storage drive riser of claim 11, wherein the detent cutout is oriented in a complementary fashion to the orientation of the detent protrusion and is large enough that the detent cutout can receive the detent protrusion.

13. A storage drive retainer to engage with a storage drive riser, comprising:
a retention nut, including:
an engagement barrel;
a spacer portion disposed at one end of the engagement barrel;
a first shoulder portion extending radially from the engagement barrel; and
a first retention protrusion extending radially from and circumferentially and continuously for 180 degrees or less around the engagement barrel and axially set apart from the first shoulder portion, the first retention protrusion configured to engage a first retention cutout of a first storage drive to retain the first storage drive to a riser board and capable of retaining the storage drive to the riser board and also capable of opposing movement of the first storage drive in both a first direction parallel to a surface of the riser board and a second direction that is perpendicular to the surface of the riser board when the first retention protrusion is oriented in a direction to engage the first storage drive; and
a retention stud, including:
an engagement pin that includes a threaded portion that is axially aligned with the engagement barrel;
a second shoulder portion extending radially from the engagement pin; and
a second retention protrusion extending radially from and circumferentially and continuously for 180 degrees or less around the engagement barrel and axially set apart from the first shoulder portion, the second retention protrusion configured to engage a second retention cutout of a second storage drive to retain the second storage drive to the riser board and capable of retaining the second storage drive to the riser board and also capable of opposing movement of the second storage drive in both a third direction parallel to a surface of the riser board and a fourth direction that is perpendicular to the surface of the riser board when the second retention protrusion is oriented in a direction to engage the second storage drive;
wherein the retention stud is to be inserted through the retention nut through a retention aperture disposed on a riser board of the storage drive riser.

14. The storage drive retainer of claim 13, wherein the retention nut includes a female threaded portion and the retention stud includes a male threaded portion to engage with the female threaded portion.

15. The storage drive retainer of claim 13, wherein the retention nut includes at least one detent protrusion extending from the first shoulder portion along the engagement barrel, and the retention stud includes at least one detent protrusion extending from the second shoulder portion along the engagement pin, the detent protrusions to each engage with a detent cutout on the riser board.

16. The storage drive retainer of claim 13, wherein the first and second retention protrusions each can engage a retention cutout in a M.2 NGFF solid state storage drive.

* * * * *